(12) United States Patent
Chang et al.

(10) Patent No.: US 10,878,915 B1
(45) Date of Patent: Dec. 29, 2020

(54) MEMORY DEVICE AND METHOD FOR PROGRAMMING THE SAME

(71) Applicant: TAIWAN SEMICONDUCTOR MANUFACTURING CO., LTD., Hsinchu (TW)

(72) Inventors: Kuo-Pin Chang, Hsinchu County (TW); Hsien-Jung Chen, Tainan (TW); Chien-Hung Liu, Hsinchu County (TW); Chih-Wei Hung, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/721,785

(22) Filed: Dec. 19, 2019

(51) Int. Cl.
| | |
|---|---|
| *G11C 16/12* | (2006.01) |
| *G11C 16/04* | (2006.01) |
| *G11C 16/24* | (2006.01) |
| *G11C 16/08* | (2006.01) |
| *G11C 16/14* | (2006.01) |
| *H01L 27/11521* | (2017.01) |

(52) U.S. Cl.
CPC .......... *G11C 16/12* (2013.01); *G11C 16/0425* (2013.01); *G11C 16/08* (2013.01); *G11C 16/14* (2013.01); *G11C 16/24* (2013.01); *G11C 2216/04* (2013.01); *H01L 27/11521* (2013.01)

(58) Field of Classification Search
None
See application file for complete search history.

(56) References Cited

U.S. PATENT DOCUMENTS

2020/0135275 A1* 4/2020 Cai ..................... G11C 16/0425

* cited by examiner

*Primary Examiner* — Ajay Ojha
(74) *Attorney, Agent, or Firm* — Maschoff Brennan

(57) ABSTRACT

A method for programming a memory device is provided. The memory device includes first to fourth memory cells, in which the first and second memory cells share a first erase gate, and the third and fourth memory cells share a second erase gate. The method includes applying a first voltage to control gates of the first and third memory cell; applying a second voltage to control gates of the second and fourth memory cells, in which the first voltage is higher than the second voltage; applying a third voltage to a select gate of the first memory cell; and applying a fourth voltage to select gates of the second to fourth memory cell, in which the third voltage is higher than the fourth voltage.

20 Claims, 5 Drawing Sheets

MEMORY DEVICE AND METHOD FOR PROGRAMMING THE SAME

BACKGROUND

A flash memory device includes a memory array having a large number of memory cells. Each of the memory cells includes a control gate and a floating gate. The floating gate holds a charge and is separated from source and drain regions in a substrate by an oxide. Each memory cell can be electrically charged by electrons injected onto the floating gate. The charge may be removed from the floating gate by tunneling to the source region or an erase gate during an erase operation. The data in flash memory cells are thus determined by the presence or absence of charge in the floating gates.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
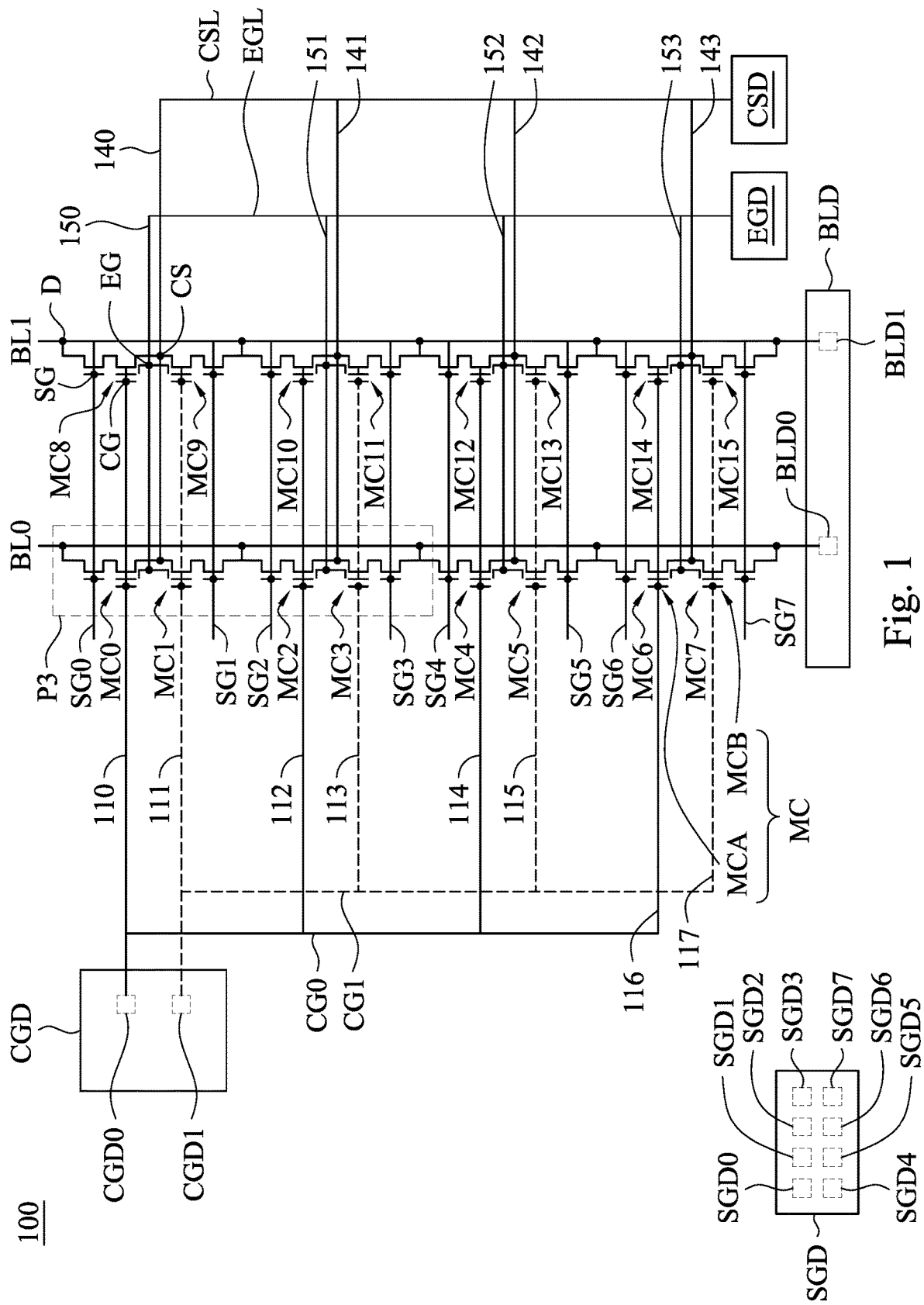
FIG. 1 is a circuit diagram of a memory device including a memory array in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Flash memory can be formed on a bulk silicon substrate and uses various bias conditions to read and write data values. For example, an EFS3 cell—or "third generation SUPERFLASH" cell—includes a pair of symmetric split gate memory cells, each of which includes a pair of source/drain regions with a channel region arranged there between. In the EFS3 architecture, one of the source/drain regions for each of the split gate memory cells is a common source/drain region shared with its neighboring cell, while the other source/drain region is an individual source/drain unique to the cell. Within each split gate cell, a floating gate is arranged over the channel region of the cell, and a control gate is arranged over the floating gate. A select gate is arranged on one side of the floating and control gates (e.g., between an individual source/drain region of the EFS3 cell and a sidewall of the floating and/or control gate). At least one memory cell is configured to store a variable charge level on its floating gate, wherein the level of this charge corresponds to a data state stored in the cell and is stored in a non-volatile manner so that the stored charge/data persists in the absence of power.

Flash memory cells can be electronically programmed and erased in memory arrays. Programming operation of these memory arrays includes charging a floating gate of a selected memory cell by applying suitable voltages to a select gate and a control gate of the selected memory cell. For example, a select gate decoder provides an on-signal to the select gate of the selected memory cell and off-signals to select gates of non-selected memory cells. In some cases, for saving chip spaces, a control gate decoder provides the same signal to the control gates of all memory cells. Since the control gates of the non-selected memory cells are provided with the same signal as that of the selected memory cell, the programming operation might be performed with undesired program disturb, which is the partial charging of the floating gates of non-selected memory cells. It is important that cells which are not selected for the programming cycle are not disturbed by the programming of the selected cell. In some cases, control gates of neighboring memory cells are controlled by different control gates.

FIG. 1 is a circuit diagram of a memory device 100 including a memory array MA in accordance with some embodiments of the present disclosure.

The memory array MA includes plural pairs of memory cells MC configured in an array. In the present embodiments, each memory cell MC includes a control gate CG, a select gate SG, a drain D, a shared common source CS, and a shared erase gate EG. Two adjacent memory cells MC may be paired and share the common source CS and the erase gate EG. For example, each pairs of the memory cells MC includes a first one of the memory cells MC (which are referred to the memory cells MCA, such as the memory cells MC0, MC2, MC4, MC6, MC8, MC10, MC12, and MC14) and a second one of the memory cells MC (which are referred to the memory cells MCB, such as the memory cells MC1, MC3, MC5, MC7, MC9, MC11, MC13, and MC15) sharing the common source SR and the erase gate EG.

In some embodiments, the memory device 100 includes plural control gate lines 110-117, plural select gate lines SG0-SG7, plural bit lines (BL) BL0 and BL1, plural common source lines 140-143, and plural erase gate lines 150-153, which are electrically coupled to the memory cells MC in the memory array MA for programing, reading, and erasing the memory cells MC. For example, each of the control gate lines 110-117 may be coupled to the control gates CG of the corresponding memory cells 110 in the same row. Each of the select gate lines SG0-SG7 may be coupled to the select gates SG of the corresponding memory cells MC in the same row. In some embodiments, each of the bit lines BL0 and BL1 may be coupled to the drains D of the corresponding memory cells MC in the same column. In some embodiments, each of the common source lines 140-143 may be coupled to the common sources CS of the corresponding memory cells MC in the same row for source bias. In some embodiments, each of the erase gate lines 150-153 may be coupled to the erase gates EG of the corresponding memory cells MC in the same row.

In the embodiments of the present disclosure, the memory device 100 further includes a control gate decoder CGD, which is a driving circuit having a control gate driver CGD0 and a control gate driver CGD1. The control gate driver CGD0 may be electrically connected to the control gate lines 110, 112, 114, and 116. The control gate driver CGD1 may be electrically connected to the control gate lines 111, 113, 115, and 117. For example, a gate line CG0 connects the control gate lines 110, 112, 114, and 116 to the control gate driver CGD0 of the control gate decoder CGD, and a gate line CG1 connects the control gate lines 111, 113, 115, and 117 to the control gate driver CGD1 of the control gate decoder CGD. The control gate decoder CGD may convert one or plural address signals into a first signal and a second signal, respectively, such that the control gate driver CGD0 and the control gate driver CGD1 may separately bias adjacent memory cells MCA and MCB in the memory cell array 200 using the first and second signals. Through the configuration, during erasing, programming, and reading operations, the control gates CG of the memory cells MCA are applied with the same first voltage (or the first signal) by the control gate driver CGD0 of the control gate decoder CGD, and the control gates CG of the memory cells MCB are applied with the same second voltage (or the second signal) by the control gate driver CGD1 of the control gate decoder CGD, in which the first voltage may be different from the second voltage. In some other embodiments, one control gate decoder having the control gate driver CGD0 and another control gate decoder having the control gate driver CGD1 may be used for providing the first and second signals, respectively.

In the present embodiments, the control gate lines 110, 112, 114, and 116 may be electrically connected to each other, and the control gate lines 111, 113, 115, and 117 may be electrically connected to each other, in which the control gate lines 111, 113, 115, and 117 are electrically isolated from the control gate lines 110, 112, 114, and 116. Through the configuration, the control gates CG of the memory cells MCA are electrically connected to each other, and the control gates CG of the memory cells MCB are electrically connected to each other, in which the control gates CG of the memory cells MCA are electrically isolated from the control gates CG of the memory cells MCB.

The memory device 100 may further include a select gate decoder SGD, which is a driving circuit having select gate drivers SGD0-SGD7 electrically connected to the select gate lines SG0-SG7, respectively. The select gate decoder SGD may convert one or plural address signals into plural cell selection signals, respectively to the select gate lines SG0-SG7 through the select gate drivers SGD0-SGD7, in order to pinpoint a specific memory cell 200. For example, in some embodiments where the memory cell MC are a n-type transistor, during read or programming operations, the select gate decoder SGD may provide positive voltage to the select gate of the selected memory cell to turn on the corresponding channel, and negative voltage to select gates of non-selected memory cells to turned off the corresponding channels.

The memory device 100 may further include an erase gate decoder EGD electrically coupled with the erase gate lines 150-153, which may be electrically connected to each other in the present embodiments. For example, a gate line EGL connects the erase gate lines 150-153 to a driver of the erase gate decoder EGD. The erase gate decoder EGD can be configured to provide a medium voltage to the erase gates EG of the memory cells MC during programming operation through the erase gate lines 151-153, and a high voltage to the erase gates EG of the memory cells MC during erasing operation through the erase gate lines 151-153. In some other embodiments, the erase gate lines 150-153 may be connected to plural drivers of the erase gate decoder EGD, respectively, such that the erase gates EG of the memory cells MC may be applied with different voltages by different drivers of the erase gate decoder EGD, respectively.

The memory device 100 may further include a bit line decoder BLD, which is a driving circuit having bit line drivers BLD1 and BLD2 electrically connected to the bit lines BL0 and BL1, respectively. During programming operation, the bit line decoder BLD may provide suitable programming current to a selected bit line (e.g., one of the bit lines BL0 and BL1), and provide inhibiting voltages to a non-selected bit line (e.g., another of the bit lines BL0 and BL1) according to one or plural address signals.

The memory device 100 may further include a source circuit CSD connected to the common sources CS through the common source lines 140-143. For example, a source line CSL connects the common source lines 140-143 to a source line driver of the source circuit CSD. The source circuit CSD may provide a medium voltage to the source line CSL during the programming operation, and the source circuit CSD may read out the logic state of the memory cells CS by comparing a current signal conducting through the bit line BL0 or BL1 with a reference current signal during the reading operation. By comparing the current signal conducting through the bit line BL0 or BL1 with the reference current signal, it is known whether the memory cell MC is turned on or off. If the memory cell MC is turned on, the resulting cell programmed state is known as '1' state. If the memory cell MC is turned off, the resulting cell programmed state is known as '0' state. In some other embodiments, the common source lines 140-143 may be connected to plural source line drivers of the source circuit CSD, respectively, such that the common sources CS of the memory cells MC may be separately detected or biased by the source circuit CSD, respectively.

Figure 2:
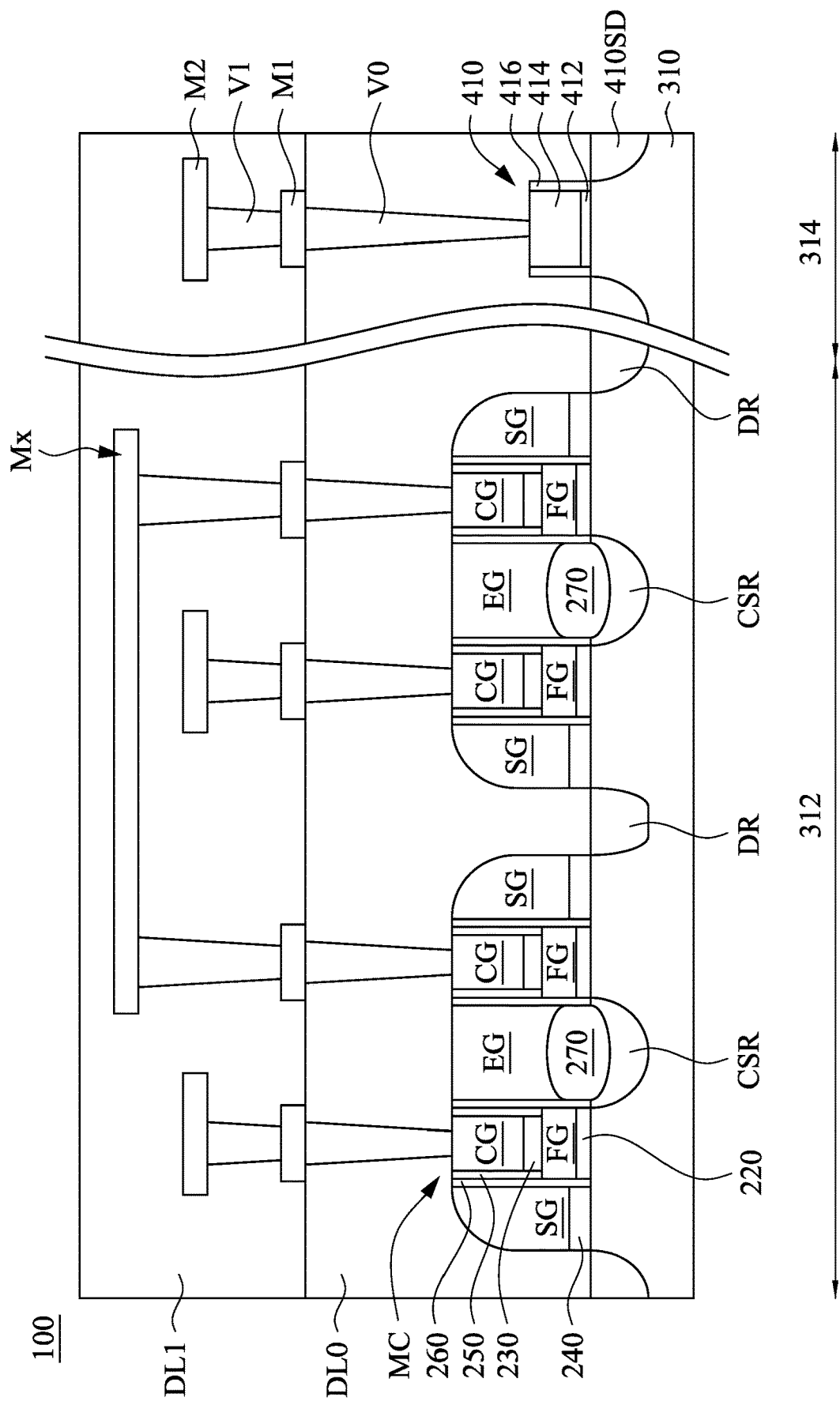
FIG. 2 is a cross-sectional view of a memory device including a memory circuit in accordance with some embodiments of the present disclosure.

FIG. 2 is a cross-sectional view of a memory device including the memory device 100 in accordance with some embodiments of the present disclosure. The memory device 100 may be formed over a substrate 310. The substrate 310 includes a cell region 312 and a peripheral region 314 located at at least one edge of the cell region 312. For example, the peripheral region 314 surrounds the cell region 312. The memory cells MC of the memory array MA (referring to FIG. 1) may be arranged over the cell region 312 of the substrate 310. The memory device 100 may further include at least one logic device 410 arranged over the peripheral region 314 of the substrate 310. The logic devices (e.g., logic devices 410) in the peripheral regions 314 may serve as high voltage devices for driving the bit lines BL0-BL1, the select gate lines SG0-SG7, and/or the control gate lines CG0-CG1 in a circuit. In some other embodiments, the logic devices (e.g., logic devices 410) in the peripheral regions 314 may serve as I/O logic devices, and/or core logic devices.

In some embodiments, the substrate 310 can be a semiconductor substrate, such as a bulk silicon substrate, a germanium substrate, a compound semiconductor substrate, or other suitable substrate. The substrate 310 may include an epitaxial layer overlying a bulk semiconductor, a silicon germanium layer overlying a bulk silicon, a silicon layer overlying a bulk silicon germanium, or a semiconductor-on-insulator (SOI) structure.

Each memory cell MC includes a tunneling layer 220, a floating gate FG, a dielectric layer 230, the control gate CG, a select gate dielectric layer 240, a select gate SG, dielectric layers 250, and dielectric layers 260. The tunneling layer 220 is formed over a channel region of the substrate 310, and the floating gate FG is formed over the tunneling layer 220. The tunneling layer 220 may be made of suitable dielectric materials, such as silicon oxide, silicon nitride, silicon oxynitride, other non-conductive materials, or combinations thereof. and the like. The floating gate FG is a feature designed to store electric charges for memory purpose. The floating gate FG is separated from the semiconductor substrate 110 by the tunneling layer 220. In some embodiments, the floating gate FG includes a conductive material, such as doped polysilicon. In some embodiments, the floating gate FG includes a dielectric material, such as silicon nitride (SiN) such that the electric charge is trapped in. In furtherance of the embodiments, the floating gate FG is formed in an oxide-nitride-oxide (ONO) stack where the floating gate FG of silicon nitride is isolated from the underlying semiconductor substrate 310 by a silicon oxide layer and is isolated from the overlying control gate CG by another silicon oxide layer.

The dielectric layer 230 may be formed over the floating gate FG, and the control gate CG may be formed over the dielectric layer 230. The dielectric layer 230 may be made of suitable dielectric materials, such as silicon oxide, silicon nitride, silicon oxynitride, other non-conductive materials, or combinations thereof. and the like. The control gate CG may include conductive material, such as polysilicon or metal.

The dielectric layers 250 may be formed on opposite sides of the stacks of the dielectric layer 230 and the control gate CG. The dielectric layers 260 may be formed and sidewalls of the dielectric layers 250 and on opposite sides of the stacks of the tunneling layer 220 and the floating gate FG. The dielectric layers 250 and the dielectric layers 260 may be made of suitable dielectric materials, such as silicon oxide, silicon nitride, silicon oxynitride, other non-conductive materials, or combinations thereof. and the like. In some other embodiments, the dielectric layers 250 and the dielectric layers 260 may also be referred to as spacers.

The select gate dielectric layers 240 may be formed over the substrate 310, and the select gate SG is formed over the select gate dielectric layers 240 on a side of the floating gate FG. The select gate dielectric layers 240 may be made of suitable dielectric materials, such as silicon oxide, silicon nitride, silicon oxynitride, other non-conductive materials, or combinations thereof. and the like. The select gate SG may include conductive material, such as polysilicon or metal.

Each memory cell MC may further include a drain region DR, a common source region CSR, a source oxide 270, and the shared erase gate EG. The drain region DR and the common source region CSR are regions formed in the substrate 310, and on opposite sides of the channel region of the substrate 310 below the control gate CG and the select gate SG. The source oxide 270 is formed over the common source region CSR. The erase gate EG is formed over the source oxide 270. The erase gate EG may include conductive material, such as polysilicon or metal. The drain D and common source CS shown in FIG. 1 may respectively be referred to as the drain region DR and the common source region CSR in FIG. 2, or features connected to the drain region DR and the common source region CSR in FIG. 2. As aforementioned, two of the memory cells MC share the common source region CSR and the shared erase gate EG.

In some embodiments, in the peripheral region 314, each logic device 410 includes a gate dielectric 412, a gate electrode 414, spacers 416, and source/drain regions 410SD. The gate dielectric 412 and the gate electrode 414 are stacked on a portion of the substrate 310, which is referred to as the channel region of the logic device 410. The gate dielectric 412 may include, for example, silicon oxide, hafnium oxide, silicon nitride, aluminum oxide, some other suitable high κ dielectric(s), or any combination of the foregoing. The gate electrode 414 overlies the gate dielectric 412 and may include, for example, doped polysilicon, a metal, some other suitable conductive material(s), or the combination thereof. In some embodiments, the gate electrode 414 may include a metal with an n-type work function or a p-type work function. The spacers 416 are formed on opposite sidewalls of the stack of the gate dielectric 412 and the gate electrode 414 for offsetting the source/drain regions 410SD. The spacers 416 may include silicon oxide, silicon nitride, silicon oxynitride, or the like. The source/drain regions 410SD are formed on opposite sides of the channel region of logic device 410, for example, by suitable implantation or epitaxy process.

The memory device 100 may further include a dielectric layer DL0 covering the memory cells MC and the logic devices 410 and plural contacts V0 connected to terminals of the memory cells MC and terminals of the logic devices 410. The memory device 100 may further include a metallization pattern Mx, which is formed in one or plural dielectric layers DL1 covering the dielectric layer DL0, the memory cells MC, and the logic devices 410. The metallization pattern Mx may include plural metal lines (e.g., the metal layers M1 and M2) and metal vias (e.g., the conductive vias V1) connected to the memory cells MC and the logic devices 410. In some embodiments, the logic devices 410 may be arranged to define address decoders, read/write circuitry, and/or other circuitry supporting operating of the memory device 100. For example, each of the control gate decoder CGD, the select gate decoder SGD, the erase gate decoder EGD, the bit line decoder BLD, and the source circuit CSD (referring to FIG. 1) may be a circuit including a number of the logic devices 410, which may be connected to some of the memory cells MC through the metallization pattern Mx. In some embodiments where the control gate decoder CGD is a circuit including the logic devices 410, the logic devices 410 may form the control gate drivers CGD0 and CGD1 of the control gate decoder CGD. In some other embodiments where the select gate decoder SGD, the erase gate decoder EGD, the bit line decoder BLD, and the source circuit CSD are circuits including the logic devices 410, the logic devices 410 may form the drivers of the select gate decoder SGD, the erase gate decoder EGD, the bit line decoder BLD, and the source circuit CSD.

In further embodiments, plural logic devices (e.g., including logic devices 410) in the peripheral regions 314 may serve as I/O logic devices, high voltage (HV) devices, and/or core logic devices. The I/O logic devices may implement I/O circuitry for inputting data to, and/or outputting data from, the integrated circuit. The HV devices are devices that operates at high voltages relative to the I/O logic devices and/or the core logic devices. In some embodiments, the HV devices drive may drive the control gate lines in a circuit. For example, the control gate decoder CGD includes the HV logic devices. In some embodiments, the erase gate decoder EGD may also include HV logic devices. The core logic devices may collectively form core circuitry for the integrated circuit. Such core circuitry may, for example, include the select gate decoder SGD, the bit line decoder BLD, the select gate decoder SGD, the erase gate decoder EGD, image signal processing (ISP) circuitry, control circuitry, some other suitable core circuitry, or any combination of the foregoing. The logic devices 410 (e.g., the I/O logic device, the HV device, and the core logic device) may be or include, for example, metal-oxide-semiconductor (MOS) device(s), MOS field-effect transistor(s) (MOSFET(s)), insulated-gate field-effect transistor(s) (IGFET(s)), some other suitable semiconductor device(s), or any combination of the foregoing.

Figure 3A:
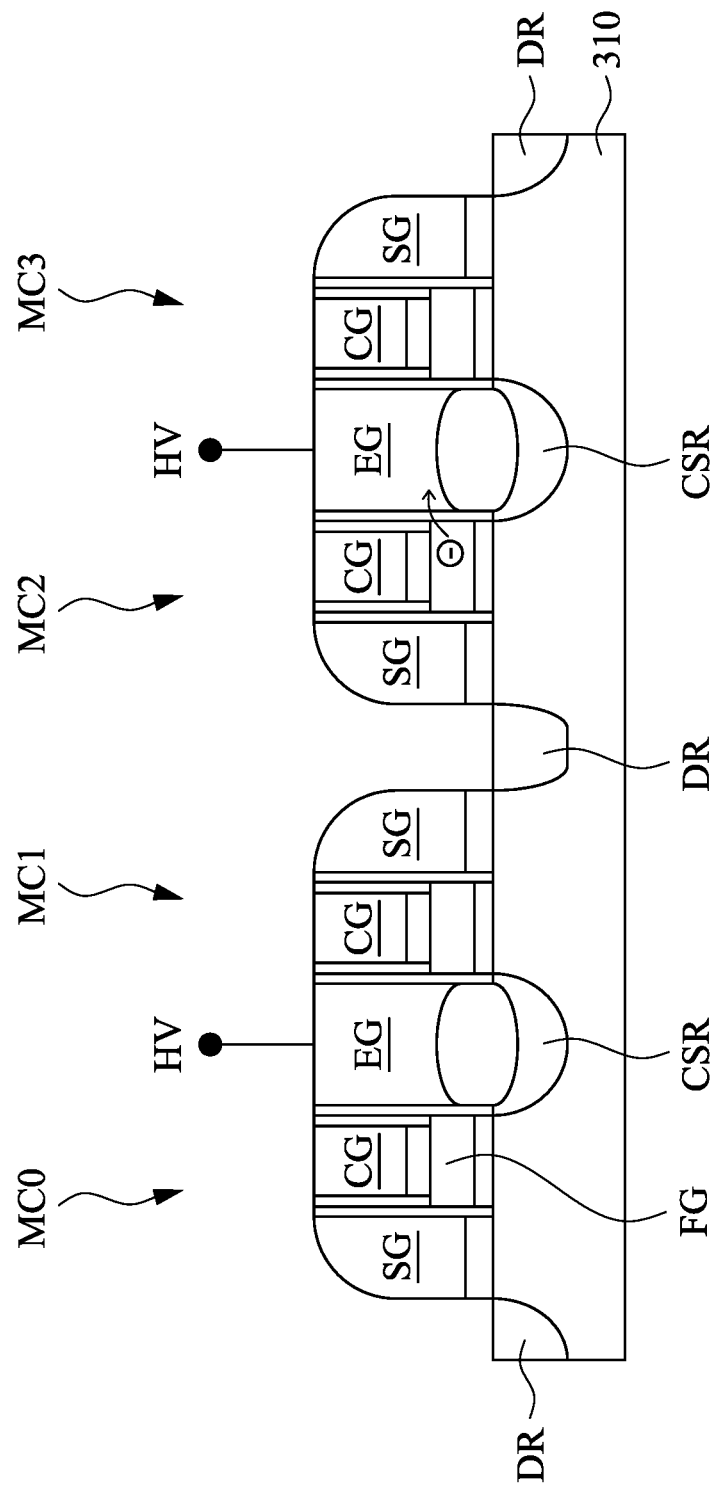
FIGS. 3A-3B illustrate cross-sectional views of a portion of the memory device at various operations of a memory device in accordance with some embodiments of the present disclosure.
Figure 3B:
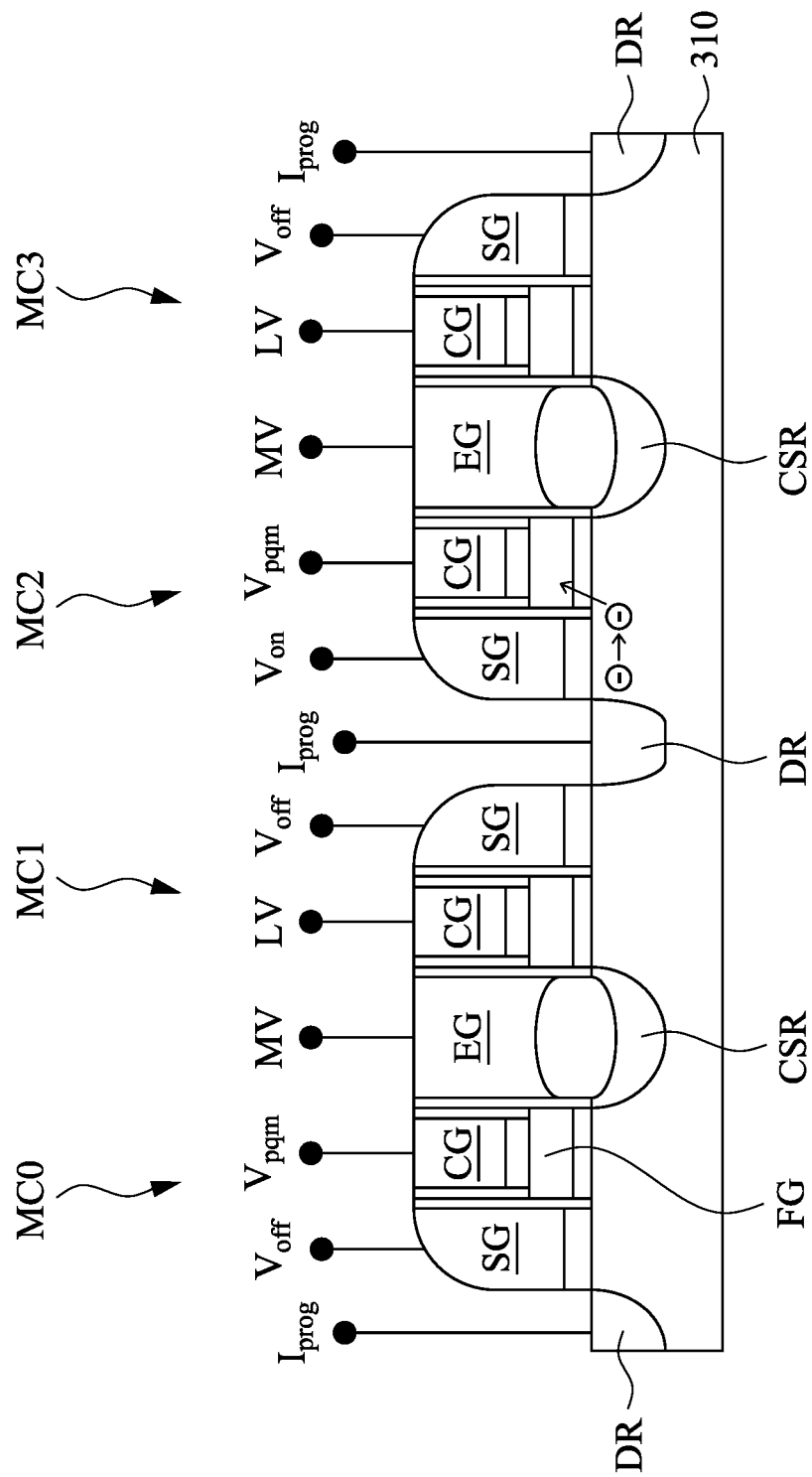

FIGS. 3A-3B illustrate cross-sectional views of a portion P3 of the memory device 100 of FIG. 1 at various operations of a memory device 100 in accordance with some embodiments of the present disclosure. Reference is made to FIG. 1 and FIGS. 3A-3B. For clear illustration, the memory cells MCA are labelled as memory cells MC0, MC2, MC4, MC6, MC8, MC10, MC12, and MC14, the memory cells MCB are labelled as memory cells MC1, MC3, MC5, MC7, MC9, MC11, MC13, and MC15, and the memory cell MC2 is exemplarily selected herein. One exemplary operation for erase and program of the memory cell MC2 is as follows.

As shown in FIG. 1 and FIG. 3A, the memory cell MC2 is erased, by applying a high voltage on the erase gate EG of the selected memory cell MC2 with other terminals of the selected memory cell MC2 (e.g., the control gate CG, the select gate SG, the drain D, the common source CS) equal to zero volt. Electrons tunnel from the floating gate FG into the erase gate EG causing the floating gate FG to be positively charged. The positively charged floating gate FG turns on the memory cell MC2 in a read operation. The resulting cell erased state is known as '1' state. In another embodiments, the erase operation is performed by applying a positive voltage on the erase gate EG of the selected memory cell MC2, a negative voltage on the control gate CG of the selected memory cell MC2, and applying zero voltages on other terminals of the selected memory cell MC2. The negative voltage on the control gate CG couples negatively the floating gate FG, hence less positive voltage on the erase gate EG is required for erasing. Electrons tunnel from the floating gate FG into the erase gate EG causing the floating gate FG to be positively charged, turning on the memory cell MC in a reading operation (cell state '1'). In some embodiments, the select gate line SG0-SG7 and the source line CSL can be negatively biased to further reduce the positive voltage on the erase gate FG needed for erase. The magnitude of negative biased voltage of the select gate line SG0-SG7 and the source line CSL in this case is small enough not to breakdown the surrounding oxide and not to forward the p/n junction. In the embodiments, while the memory cells MC0-MC1 and MC3-MC15 are connected to the same erase gate line EGL or the same terminal of the erase gate decoder EGD, the memory cells MC0-MC1 and MC3-MC15 may also be erased when the memory cell MC2 is erased. In some other embodiments where the memory cells MC0-MC1 and MC3-MC15 are connected to different terminals of the erase gate decoder EGD, the memory cells MC0-MC1 and MC3-MC15 may not be erase when the memory cell MC2 is erased.

As shown in FIG. 1 and FIG. 3B, the memory cell MC2 is programmed, by applying a programming voltage $V_{prog}$ on the control gate CG, an on-voltage $V_{on}$ on the select gate SG, a medium voltage MV on the common source CS, a medium voltage MV on the erase gate EG, and a programming current $I_{prog}$ on the bit line BL0. Through the configuration, a portion of electrons flowing across the gap between the drain region DR (or the bit line BL0) and the floating gate FG acquire enough energy to inject into the floating gate FG causing the floating gate FG to be negatively charged, turning off the memory cell MC2 in reading operation. The resulting cell programmed state is known as '0' state.

In some embodiments, the memory cells MC0-MC1 and MC3-MC7 in its column can be stopped from programming by applying an off-voltage $V_{off}$ on the select gate SG. In some embodiments, the memory cells MC8-MC15 can be inhibited in programming by applying an inhibit voltage on the bit line BL1. Through the configuration, a row of flash memory cells is selected using one of the select gate lines SG0-SG7 and one of the gate lines CG0-CG1, and a column of flash memory cells is selected using one of bit lines BL1 and BL2. Through the configuration, a specific flash memory cell is selected using a combination of a select gate line, a control gate line, and a bit line.

In some cases, when a control gate decoder provides the same signal to the control gates of all memory cells for saving chip spaces, the control gate CG of the memory cell MC3 adjacent to the selected memory cell MC2 may attract the hot carrier flow from the channel region below the floating gate FG of the selected memory cell MC2 to the channel region below the floating gate FG of the memory cell MC3. This may result in undesired program disturb, which means the floating gate FG of non-selected memory cell MC3 may be partially charged during programing operation. The undesired program disturb may also occur in the memory cell MC3.

In the embodiments of the present disclosure, the memory cells MC3 adjacent to the selected memory cell MC2 in its column are further stopped from programming by applying a low voltage LV on the control gate CG of the memory cells MC3 during programing operation. Through the configuration, the channel region below the floating gate FG of the memory cell MC3 is turned off, and the hot carrier may not flow from the channel region below the floating gate FG of the selected memory cell MC2 to the channel region below the floating gate FG of the memory cell MC3. Similarly, the memory cells MC1, MC5, MC7, MC9, MC11, MC13, and MC15 are further stopped from programming by applying a low voltage on the control gate CG of the memory cells MC1, MC5, MC7, MC9, MC11, MC13, and MC15 when the memory cell MC2 is selected.

In some embodiments of the present disclosure, during programming operation, the programming voltage $V_{prog}$ applied to the control gate line connected to the selected memory cell may be in a range from about 10 Volts to about 12 Volts, and the low voltage LV applied to the other control gate lines may be in a range from about 0 Volts to about 2 Volts. The medium voltage MV applied to the erase gate and the common source may be in a range from about 3.5 Volts to about 5 Volts. The programming current $I_{prog}$ applied to the bit line connected to the selected memory cell may be in a range from about 1 to about 2 microamperes (uA), and the inhibited voltage applied to the other bit lines may be in a range from about 1.3 to about 1.6 voltages. The on-voltage Von applied to the select gate line connected to the selected memory cell may be in a range from about 9 Volts to about 12 Volts, and the off-voltage $V_{off}$ applied to other select gate lines may be in a range from about 0 to about 2 Volts.

In the present embodiments, the memory cells MC are n-type transistors having p-type channel regions, in which the drain regions DR and the common source regions CS of are doped to n-type. In the disclosed method of reading operation to the flash memory array MA, an electrical bias is applied to a non-selected select gate line. In the present embodiments, the non-selected select gate line during the reading operation is biased to a negative voltage to force the corresponding channel to be turned off. In some other embodiments, if the flash memory cells are p-type transistors having n-type channel regions in which the drain regions DR and the common source regions CS are doped to p-type, then electrical bias applied to the select gate line of a non-selected flash memory cell will be reversed accordingly. More specifically, a non-selected flash memory cell having p-type source/drain and n-type channel, the electrical bias to the non-selected select gate line is a positive voltage to turn off the corresponding channel.

Figure 4:
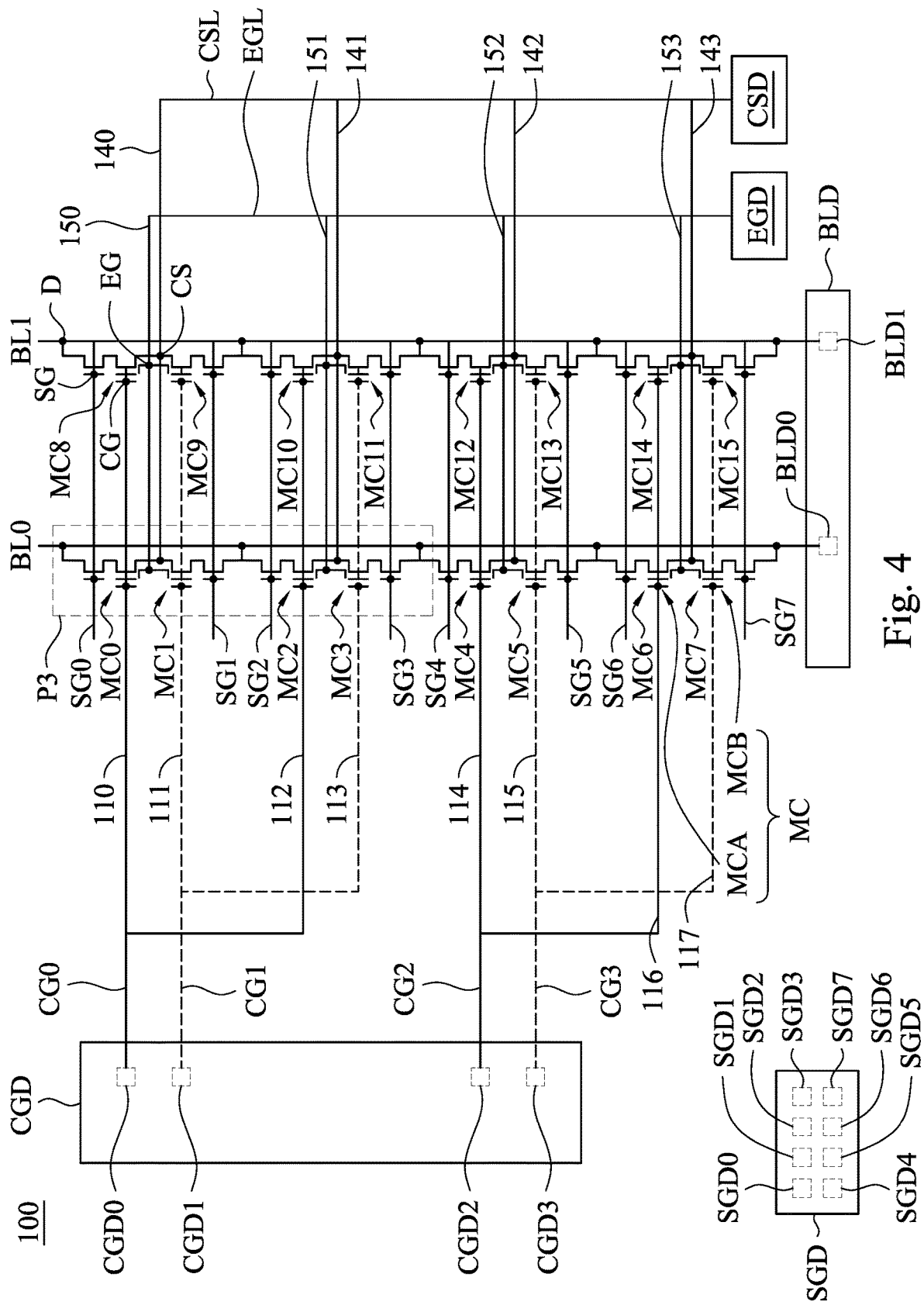
FIG. 4 is a circuit diagram of a memory device including a memory array in accordance with some embodiments of the present disclosure.

FIG. 4 is a circuit diagram of a memory device 100 including a memory array MA in accordance with some embodiments of the present disclosure. The present embodiments are similar to the embodiments of FIG. 1, and at least one difference between the present embodiments and the embodiments of FIG. 1 is that: the control gate lines 110 and 112 are electrically connected to each other, the control gate lines 111 and 113 are electrically connected to each other, the control gate lines 114 and 116 are electrically connected to each other, and the control gate lines 115 and 117 are electrically connected to each other. A combination of the control gate lines 110 and 112, a combination of the control gate lines 111 and 113, a combination of the control gate lines 114 and 116, and a combination of the control gate lines 115 and 117 are electrically isolated from each other.

In the present embodiments, the control gate decoder CGD has control gate drivers CGD0-CGD3. The control gate driver CGD0 may be electrically connected to the control gate lines 110 and 112 through a gate line CG0. The control gate driver CGD1 may be electrically connected to the control gate lines 111 and 113 through a gate line CG1. The control gate driver CGD2 may be electrically connected to the control gate lines 114 and 116 through the gate line CG3. The control gate driver CGD3 may be electrically connected to the control gate lines 115 and 117 through the gate line CG4. The control gate decoder CGD may convert one or plural address signal into first to fourth signals, respectively to the control gate drivers CGD0-CGD3, in order to separately bias adjacent memory cells MC in the memory cell array MA. Through the configuration, during erasing, programming, and reading operations, the control gates CG of a portion of the memory cells MCA (e.g., the memory cells MC0, MC2, MC8, and MC10) are applied with the same first voltage (or the first signal) by the control gate driver CGD0, the control gates CG of a portion of the memory cells MCB (e.g., the memory cells MC1, MC3, MC9, and MC11) are applied with the same second voltage (or the second signal) by the control gate driver CGD1, the control gates CG of another portion of the memory cells MCA (e.g., the memory cells MC4, MC6, MC12, and MC14) are applied with the same third voltage (or the third signal) by the control gate driver CGD2, the control gates CG of another portion of the memory cells MCB (e.g., the memory cells MC5, MC7, MC13, and MC15) are applied with the same fourth voltage (or the fourth signal) by the control gate driver CGD3.

In some embodiments, depending on the selected memory cells, one of the first to fourth voltages may be different from others of the first to fourth voltages, in which the others of the first to fourth voltages may be similar to each other. For example, the memory cell MC2 is programmed, by applying a high voltage on the control gate CG, an on-voltage on the select gate SG, a medium voltage on the common source CS, a medium voltage on the erase gate EG, and a programming current on the bit line BL0. A portion of electrons flowing across the gap between the drain region DR (or the bit line BL0) and the floating gate FG acquire enough energy to inject into the floating gate FG causing the floating gate FG to be negatively charged, turning off the memory cell MC2 in reading operation. The resulting cell programmed state is known as '0' state.

In some embodiments, the memory cells MC0-MC1 and MC3-MC7 in its column can be stopped from programming by applying an off-voltage on the select gate SG. In some embodiments, the memory cells MC8-MC15 can be inhibited in programming by applying an inhibit voltage on the bit line BL1. Through the configuration, a row of flash memory cells is selected using one of the select gate lines SG0-SG7 and one of the gate lines CG0-CG3, and a column of flash memory cells is selected using one of bit lines BL0 and BL1. Through the configuration, a specific flash memory cell is selected using a combination of a select gate line, a control gate line, and a bit line.

In the embodiments of the present disclosure, the memory cells MC3 adjacent to the selected memory cell MC2 in its column are further stopped from programming by applying a low voltage on the control gate CG of the memory cells MC3. Through the configuration, the channel region below the floating gate FG of the memory cell MC3 is turned off, and the hot carrier may not flow from the channel region below the floating gate FG of the selected memory cell MC2 to the channel region below the floating gate FG of the memory cell MC3. Similarly, the memory cells MC1, MC3-MC7, M9, and M11-M15 are further stopped from programming by applying a low voltage on the control gates CG of the memory cells MC1, MC3-MC7, M9, and M11-M15.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the control gates of two adjacent memory cells in the same column may be applied with different voltages, such that the non-selected memory cells adjacent to the selected memory cell in its column can be further stopped from programming by applying a low voltage on the control gates of the non-selected memory cells. Another advantage is that the number of different signals provided by the control gate decoder to the memory cells is less than the number of the memory cells in the same column, the number of the control gate drivers of the control gate decoder is reduced, thereby reducing the area of the control gate decoder, which in turn will save chip spaces.

According to some embodiments of the present disclosure, a method for programming a memory device is provided. The memory device includes first to fourth memory cells, in which the first and second memory cells share a first erase gate, and the third and fourth memory cells share a second erase gate. The method includes applying a first voltage to a control gate of the first memory cell and a control gate of the third memory cell; applying a second voltage to a control gate of the second memory cell and a control gate of the fourth memory cell, wherein the first voltage is higher than the second voltage; applying a third voltage to a select gate of the first memory cell; and applying a fourth voltage to a select gate of the second memory cell, a select gate of the third memory cell, and a select gate of the fourth memory cell, wherein the third voltage is higher than the fourth voltage.

According to some embodiments of the present disclosure, a method for programming a memory device is provided. The memory device includes a selected memory cell, a first non-selected memory cell, and a second non-selected memory cell arranged in a column. The method includes applying a first voltage to a control gate of the selected memory cell and a control gate of the first non-selected memory cell; applying a second voltage to a control gate of the second non-selected memory cell, in which the first voltage is higher than the second voltage; applying a third voltage to a select gate of the selected memory cell; and applying a fourth voltage to a select gate of the first non-selected memory cell and a fifth voltage to a select gate of the second non-selected memory cell, in which the third voltage is higher than the fourth voltage and the fifth voltage.

According to some embodiments of the present disclosure, a memory device includes a first memory cell, a second memory cell, and a third memory cell. The first memory cell includes a first floating gate and a first control gate over the first floating gate. The second memory cell includes a second floating gate and a second control gate over the second floating gate. The third memory cell includes a third floating gate and a third control gate over the third floating gate, in which the second memory cell is between the first memory cell and the third memory cell, and the third control gate is electrically connected to the first control gate and electrically isolated from the second control gate, in which a plurality of first source/drain regions of the first to third memory cells are electrically connected to each other.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for programming a memory device, the memory device comprising first to fourth memory cells, wherein the first and second memory cells share a first erase gate, and the third and fourth memory cells share a second erase gate, the method comprising:
applying a first voltage to a control gate of the first memory cell and a control gate of the third memory cell;
applying a second voltage to a control gate of the second memory cell and a control gate of the fourth memory cell, wherein the first voltage is higher than the second voltage;
applying a third voltage to a select gate of the first memory cell; and applying a fourth voltage to a select gate of the second memory cell, a select gate of the third memory cell, and a select gate of the fourth memory cell, wherein the third voltage is higher than the fourth voltage.

2. The method of claim 1, wherein each of the first to fourth memory cells comprises a first source/drain region and a second source/drain region, the method further comprising:
applying a current to a bit line connected to the first source/drain regions of the first to fourth memory cells.

3. The method of claim 2, further comprising:
applying a medium voltage to the second source/drain regions of the first to fourth memory cells, wherein the medium voltage is higher than the second voltage and lower than the first voltage.

4. The method of claim 1, further comprising:
applying a medium voltage to the first erase gate and the second erase gate, wherein the medium voltage is higher than the second voltage and lower than the first voltage.

5. The method of claim 1, wherein the memory device further comprises fifth and sixth memory cells, wherein the fifth and sixth memory cells share a third erase gate, the method comprising:
applying the first voltage to a control gate of the fifth memory cell;
applying the second voltage to a control gate of the sixth memory cell; and
applying the fourth voltage to a select gate of the fifth memory cell and a select gate of the sixth memory cell.

6. The method of claim 5, wherein each of the first to sixth memory cells comprises a first source/drain region and a second source/drain region, the method further comprising:
applying a current to the first source/drain regions of the first to fourth memory cells through a first bit line; and
applying an inhibiting voltage to the first source/drain regions of the fifth and sixth memory cells through a second bit line.

7. The method of claim 6, further comprising:
applying a medium voltage to the second source/drain regions of the first to sixth memory cells, wherein the medium voltage is higher than the second voltage and lower than the first voltage.

8. A method for programming a memory device, the memory device comprising a selected memory cell, a first non-selected memory cell, and a second non-selected memory cell arranged in a column, the method comprising:
applying a first voltage to a control gate of the selected memory cell and a control gate of the first non-selected memory cell;
applying a second voltage to a control gate of the second non-selected memory cell, wherein the first voltage is higher than the second voltage;
applying a third voltage to a select gate of the selected memory cell; and
applying a fourth voltage to a select gate of the first non-selected memory cell and a fifth voltage to a select gate of the second non-selected memory cell, wherein the third voltage is higher than the fourth voltage and the fifth voltage.

9. The method of claim 8, wherein applying the first voltage to the control gate of the selected memory cell and the control gate of the first non-selected memory cell is performed through a first control gate driver.

10. The method of claim 9, wherein applying the second voltage to the control gate of the second non-selected memory cell is performed through a second control gate driver.

11. The method of claim 8, wherein applying the third voltage to the select gate of the selected memory cell and applying the fourth voltage to the select gate of the first non-selected memory cell and the fifth voltage to the select gate of the second non-selected memory cell is performed respectively through a plurality of select gate drivers.

12. The method of claim 8, wherein the selected memory cell and the second non-selected memory cell share an erase gate.

13. A memory device, comprising:
   a first memory cell comprising a first floating gate and a first control gate over the first floating gate;
   a second memory cell comprising a second floating gate and a second control gate over the second floating gate; and
   a third memory cell comprising a third floating gate and a third control gate over the third floating gate, wherein the second memory cell is between the first memory cell and the third memory cell, and the third control gate is electrically connected to the first control gate and electrically isolated from the second control gate, wherein a plurality of first source/drain regions of the first to third memory cells are electrically connected to each other.

14. The memory device of claim 13, wherein the first and second memory cell share an erase gate.

15. The memory device of claim 13, further comprising:
   a control gate decoder having a first control gate driver and a second control gate driver, wherein the first control gate driver is electrically connected to the first and third control gates, and the second control gate driver is electrically connected to the second control gate.

16. The memory device of claim 13, wherein the first to third memory cells further comprise first to third select gates disposed on a side of the first to third floating gates, respectively, the memory device further comprises:
   a select gate decoder having first to third select gate drivers connected to the first to third select gates, respectively.

17. The memory device of claim 13, further comprising:
   a bit line electrically connected to the first source/drain regions of the first to third memory cell.

18. The memory device of claim 13, further comprising:
   a fourth memory cell comprising a fourth floating gate and a fourth control gate over the fourth floating gate, wherein the fourth control gate is electrically connected to the second control gate and electrically isolated from the first control gate and the third control gate, wherein the third and fourth memory cells share an erase gate.

19. The memory device of claim 13, further comprising:
   a fifth memory cell comprising a fifth floating gate and a fifth control gate over the fifth floating gate wherein the fifth control gate is electrically connected to the first control gate; and
   a sixth memory cell comprising a sixth floating gate and a sixth control gate over the sixth floating gate, wherein the fifth and sixth memory cell share an erase gate, and the sixth control gate is electrically connected to the second control gate, wherein a plurality of source/drain regions of the fifth and sixth memory cells are electrically connected to each other and electrically isolated from the first source/drain regions of the first to third memory cell.

20. The memory device of claim 19, further comprising:
   a first bit line electrically connected to the first source/drain regions of the first to third memory cell; and
   a second bit line electrically connected to the source/drain regions of the fifth and sixth memory cells.

* * * * *